United States Patent [19]

Agrawal et al.

[11] Patent Number: 5,043,986
[45] Date of Patent: Aug. 27, 1991

[54] METHOD AND INTEGRATED CIRCUIT ADAPTED FOR PARTIAL SCAN TESTABILITY

[75] Inventors: Vishwani D. Agrawal, New Providence; Kwang-Ting Cheng, North Plainfield, both of N.J.

[73] Assignee: AT&T Bell Laboratories, Murray Hill, N.J.

[21] Appl. No.: 354,178

[22] Filed: May 18, 1989

[51] Int. Cl.⁵ .................. G01R 31/18; G01R 31/26
[52] U.S. Cl. .................. 371/25.1; 371/22.3; 371/22.6; 371/22.5
[58] Field of Search .................. 371/22.3, 22.6, 22.5, 371/25.1, 15.1

[56] References Cited

U.S. PATENT DOCUMENTS

| | | | |
|---|---|---|---|
| 4,493,077 | 8/1985 | Agrawal | 371/25 |
| 4,534,028 | 8/1985 | Trischler | 371/25 |
| 4,669,061 | 5/1987 | Bhavsar | 365/154 |
| 4,680,761 | 7/1987 | Burkness | 371/25 |
| 4,837,765 | 6/1989 | Suzuki | 371/25 |
| 4,847,800 | 7/1989 | Daane | 364/717 |
| 4,856,002 | 8/1989 | Sakashita et al. | 371/21 |
| 4,860,290 | 8/1989 | Daniels et al. | 371/25 |
| 4,872,169 | 10/1989 | Whetsel, Jr. | 371/22.3 |
| 4,894,830 | 6/1990 | Kawai | 371/22.3 |
| 4,918,378 | 4/1990 | Katircioglu et al. | 365/201 |
| 4,929,889 | 5/1990 | Seiler et al. | 371/22.3 |
| 4,942,577 | 7/1990 | Dzaki | 371/22.3 |

Primary Examiner—Jerry Smith
Assistant Examiner—Ly V. Hua
Attorney, Agent, or Firm—J. W. Herndon; G. E. Nelson

[57] ABSTRACT

A method of partial scan design for chip testing and a circuit produced in accordance with the method in which the selection of scan memory elements eliminates cycles in the circuit while the circuit is in a test mode. Cycles are defined as feedback paths from an output of a memory element to an input of the memory element. Cycle length is the number of memory elements in a feedback path. Experimental data suggests that test complexity grows exponentially with the cycle length. By eliminating cycles of desired lengths, the set of scan memory elements may be only a small fraction of the total memory elements of a circuit.

11 Claims, 2 Drawing Sheets

ND INTEGRATED CIRCUIT
METHOD AND INTEGRATED CIRCUIT ADAPTED FOR PARTIAL SCAN TESTABILITY

TECHNICAL FIELD

The invention pertains to the field of circuit testing and, in particular, it pertains to the testing of integrated logic circuits by partial scan techniques.

BACKGROUND OF THE INVENTION

Present day VLSI (Very Large Scale Integration) logic circuit fabrication techniques typically require the realization of chips that contain literally thousands of circuit elements. The state of the art is such that the yield of fault-free chips is substantially less than 100 percent. This, in turn, means that it is economically advantageous that chips be tested for correct operation after fabrication and before incorporation into other circuits. The testing of complex and highly integrated chips obviously is a difficult task. At one time, such testing was done by testing machines in which a large number of electrically conductive probes contacted selected circuit nodes of a chip for the application of test signals and the accessing of test results. As the number of circuit components increased, however, the number of probes required to test adequately a chip by this method became unmanageable.

One technique to avoid the use of multiple probes for test access uses an electron beam which is focused and deflected to different points of a chip surface to control the state of the circuit by charging chip nodes. This technique is inherently slow and has the potential of damaging the chip. So-called full and partial scan techniques have also been used for chip testing. U.S. Pat. Nos. 4,534,028 to Trischler and 4,493,077 to Agrawal are examples of scan techniques. In scan testing, test control circuitry is included as part of the logic of a chip. Externally generated mode control signals are used to switch a chip from a functional mode into a test mode. In the test mode, some or all of the memory elements of the chip are disconnected from the remaining logic elements of the chip and the disconnected memory elements are reconfigured into a shift register. While in the test mode, test data is shifted into the shift register. The chip is then placed into the operational mode for a brief period so that the circuit may react to the presence of the test data. The chip is then again placed into the test mode and the state of the shift register is read out and compared with an expected fault-free result. This technique is called full scan testing if all of the memory elements of a chip are reconfigurable into the test mode shift register. If less than all memory elements are reconfigurable, the technique is called partial or incomplete scan testing.

With full scan testing, the overhead in terms of the chip area required for the additional test control circuitry amounts generally to about 10 percent in typical cases. In addition, the test control circuitry exacts a penalty in the speed of operation of the circuit. These undesirable consequences are reduced somewhat with partial scan testing. However, in partial scan testing, the scan memory elements must be carefully selected using some type of testability analysis to maintain fault detection coverage. As a practical matter, partial scan still requires that most of the memory elements of a circuit be scannable. That is, that most of the memory elements be reconfigurable into the test mode shift register. The best that has been accomplished in partial scan testing is a reduction of the scan memory elements to about 50 percent of the total memory elements of a circuit. This, in turn, reduces the chip area overhead to about 5 percent of the total chip area and improves the operational speed of the circuits somewhat over the full scan technique. However, because of these penalties, full and partial scan techniques have not received widespread acceptance. This is due, in part, because of the trend toward larger, more complicated chips and because of the fact that yield decreases dramatically as chip size increases beyond a critical point. Therefore, it would be desirable if the number of scan memory elements could be reduced to a small fraction of the whole, without degradation in the ability to fully test an integrated circuit and without significant penalty in operational speed of the circuit.

SUMMARY OF THE INVENTION

An advance is made in a method of testing digital integrated circuits by partial scan techniques. A circuit arranged according to the invention includes memory elements and associated combinational logic. The method comprises the steps of establishing a test mode of the circuit by electrically isolating from the combinational logic the functional data inputs of a subset of the memory elements of the circuit. The members of the subset are chosen such that, while in the test mode, substantially all feedback paths equal to or greater than a selected cycle length in the circuit are eliminated. A feedback path is defined as a signal path from an output of a memory element to the functional data input of the memory element and the cycle length of a feedback path is defined as the number of other memory elements in the feedback path. The isolated memory elements are reconfigured while in test mode to accept input test data. Such test data is loaded into the isolated memory elements and the circuit is then placed into an operational non-test mode for a predetermined test period. At the expiration of the test period, the test mode of the circuit is reestablished and the state of the isolated memory elements is read out for comparison with known fault-free test results.

Preferably, scan elements are selected to eliminate all cycles of a circuit. However, as a practical consideration, virtually all of the benefits of the invention may be obtained by eliminating less than all cycles. For example, to further reduce the number of scan memory elements, self loops having cycle lengths of zero might be retained during testing. Similarly, one might chose to retain some or all cycles of cycle length of one.

An integrated logic circuit, designed in accordance with the principles of the invention includes means responsive to a test mode signal for electrically isolating selected ones of the memory elements from the combinational logic and for reconfiguring the selected memory elements while in the isolated state to accept test data. In this state, the isolation of the selected memory elements eliminates substantially all of the feedback paths of the circuit having a cycle length equal to or greater than a selected cycle length. The circuit further comprises means for independently controlling the synchronous operation of the scan and non-scan memory elements.

Apart from achieving a low overhead, this work makes the partial scan concept more attractive for two other reasons: (1) the selection of scan flip-flops does not rely on testability measures and allows the use of automatic sequential test generators, and (2) the reliance on functional tests, that merely verify the design, as opposed to testing "stuck at" faults, is eliminated.

DETAILED DESCRIPTION

The problem of testing sequential circuits is recognized to be a very difficult problem, in general. The difficulty arises in great part because of poor controllability and observability of memory elements. In practice, the level of difficulty is circuit-dependent. Some circuits can be easily tested, while others take enormous computing effort.

The basis of the invention rests on the realization that the complexity of testing an integrated circuit is controlled in great part by the number of cycles present in the integrated circuit. For purposes of this disclosure, cycles are defined as feedback paths from an output of a memory element to an input of the memory element. Cycle length is the number of memory elements in a cycle feedback path, excluding the primary memory element to which the feedback path pertains. Experimental data suggests that test generation complexity grows exponentially with the cycle length. In the absence of such cycles, even large sequential depth causes no serious problems in testing. For purposes of this disclosure, sequential depth is defined as the largest number of memory elements on a path between an input and an output of a circuit.

Figure 1:
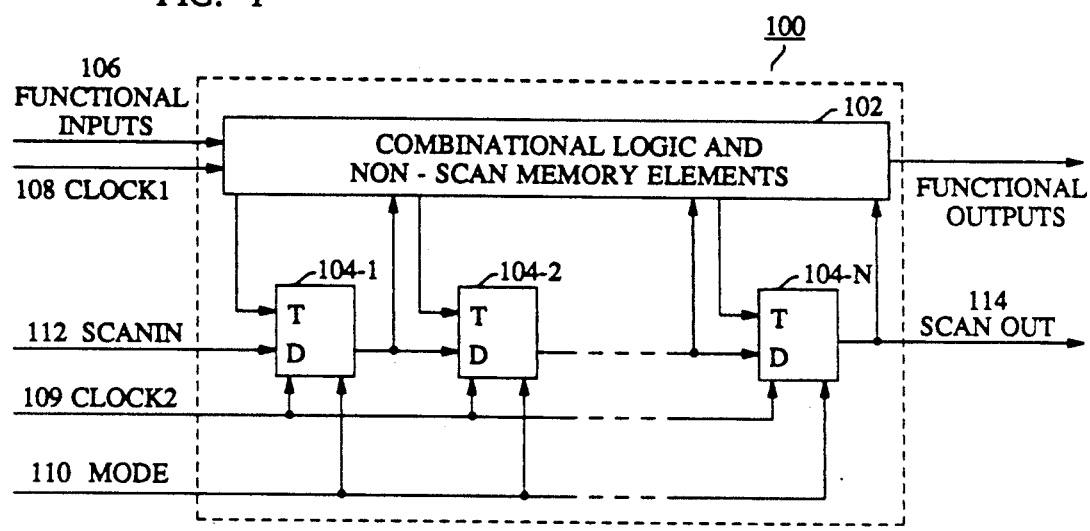
FIG. 1 shows a block diagram of a digital circuit including combinational logic and non-scan memory elements and scan memory elements which may be configured in a test mode into a shift register for the reception of test vectors and reading of test results.

FIG. 1 shows the structure of an integrated circuit 100 arranged for partial scan testing in accordance with the invention. The circuit consists of combinational logic and memory elements that are electrically connected to the logic in an appropriate manner according to the specific function the circuit is designed to perform. In accordance with an aspect of the invention, most of the memory elements will be non-scan elements. That is, they will not be configurable into a shift register in a test mode to accept test input data. The combinational logic and the non-scan memory elements are included in the circuitry 102. Shown external to circuitry 102 are the scan memory elements 104-1 through 104-N. The circuit 100 has one or more functional inputs shown as 106. A CLOCK1 input 108 controls the synchronous operation of the circuit. For the normal operation of the circuit, the same control signal is provided to the scan memory elements through the CLOCK2 lead 109. A MODE input controls the mode of operation of the circuit. When MODE is non-active, circuit 100 is in a non-test mode in which it operates in its intended functional manner. In this functional mode, the scan memory elements 104 operate as normal circuit state elements. When MODE is active, circuit 100 is placed into the test mode. The CLOCK1 signal is held inactive while the CLOCK2 signal is activated. In this mode, the scan memory elements 104 are electrically disconnected from the influence of the circuitry 102. This preferably is accomplished internally to each of the elements 104 by making each element 104 insensitive to the input states appearing at their inputs T from circuitry 102. This also eliminates any feedback path that otherwise is present at the scan memory element. At the same time, the inputs D of the scan memory elements 104 are internally enabled by the presence of the MODE signal. This reconfigures the scan elements into a shift register having a serial input from the SCANIN lead 112. The memory elements 104 might be realized as shown in U.S. Pat. No. 4,669,061 to D. Bhavsar, as one example.

Testing of the circuit 100 might proceed as follows. First, the scan memory elements 104 are tested by asserting MODE and then inputting appropriate data into the scan elements via SCANIN 112 to test the ability of each scan element to be set and reset. The tests are verified by reading the state of SCANOUT 114 as the test data is shifted through the scan elements. Next, the overall circuit 100 is tested. Again, MODE is asserted and test data is inputted into the scan elements 104. When an appropriate test vector is loaded into 104, MODE is deasserted for an appropriate period, such as one clock cycle. During this period, circuit 100 behaves in a functional manner. The circuitry 102 responds to the states of the scan elements 104 and, in turn, the states of the scan elements will likely change in some manner under the control of circuitry 102. At the end of the functional period, MODE is again asserted and the states of scan elements can be sequentially read at SCANOUT 114 by an appropriate device. This procedure is repeated with a number of different test patterns to achieve a desired level of fault coverage of the circuit.

Figure 2:
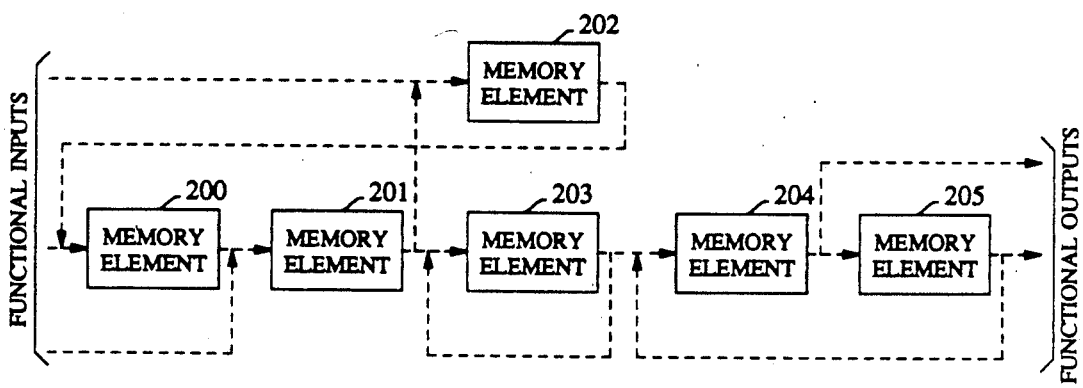
FIG. 2 shows a simplified illustrative digital logic circuit for use in describing the invention.
Figure 3:
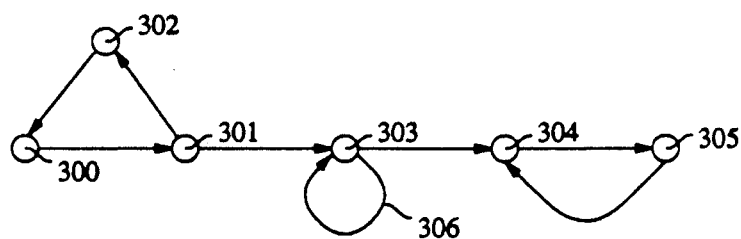
FIG. 3 shows a directed graph in which nodes represent the memory element of FIG. 2 and arrows between nodes represent combinational signal paths between the nodes.

The problem is to design a circuit in which the scan memory elements are minimized without sacrificing testability and fault coverage. FIG. 2 shows an example of a sequential logic circuit in which the scan memory elements have not yet been selected. The elements 200 through 205 represent memory elements, such as flip-flops or latches. The dashed lines represent signal flow through combinational logic elements. The precise character of the logic represented by the dashed lines is irrelevant for purposes here. The circuit is synchronous and all memory elements are controlled by a clock signal, not shown, such as CLOCK 108 in FIG. 1. A directed graph of this circuit is shown in FIG. 3. Each vertex 300 through 305 of the graph represents the corresponding memory element 200 through 205 of FIG. 2. A line between vertices of FIG. 3 implies that there exists a combinational logic path between the vertices. Only the memory elements and the combinational logic dependencies between memory elements are represented in the graph of FIG. 3. FIG. 3 shows that there exists three feedback paths in the circuit, one encompassing vertices 300, 301 and 302, a self-loop 306 at vertex 303 and a third path encompassing vertices 304 and 305. The first cycle has a length of 2. That is, starting at any of the vertices 300, 301 or 302, the number of other memory elements traversed in a path from the output of the selected vertex to the input of the selected vertex is two. The self-loop at vertex 303 contains no other memory element and therefore has a cycle length of 0. The third cycle at vertices 304 and 305 has a length of one.

An aspect of the invention is a methodology of selecting a reduced set of scan flip-flops for testability, without sacrificing fault coverage. The methodology is to select the scan elements so as to eliminate most or all of the cycles when test mode is entered. Test complexity is minimized if all cycles, including self-loops of zero cycle length are broken. However, because the number of self-loops of zero cycle length in a circuit can be quite large, it may be advantageous for some circuits to exclude as scan elements the memory elements associated with zero length cycles. In other words, most of the advantages of the invention can be obtained without eliminating all cycles in test mode. This reduces the scan overhead in terms of chip area required for test access and sacrifices little in the way of test complexity and fault coverage.

Figure 4:
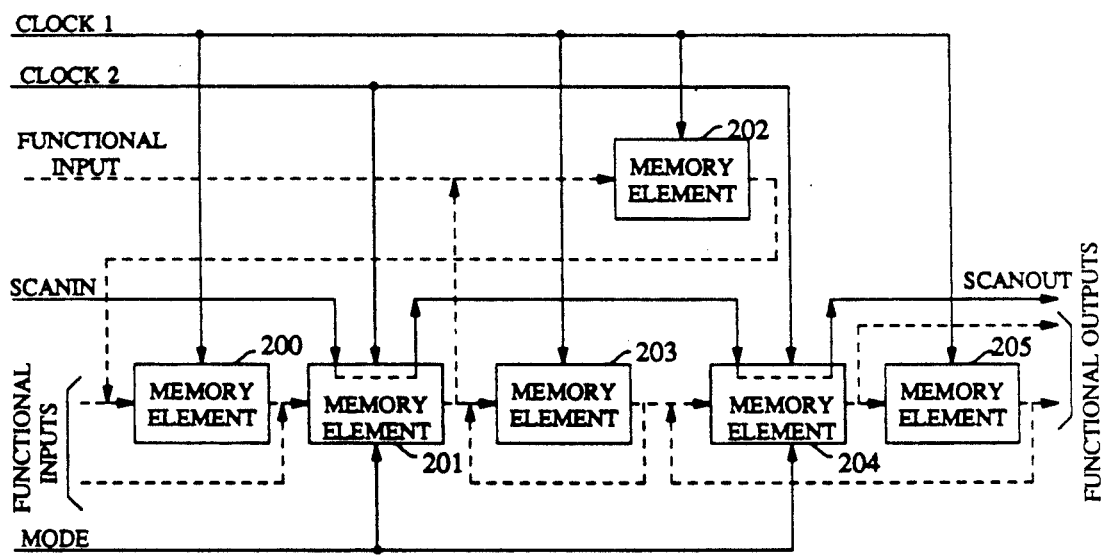
FIG. 4 shows the circuit of FIG. 2 in which selected ones of the memory elements have been selected as scan memory elements for testability.

Thus, in FIG. 3, if memory elements 301 and 304, for example, are selected as scan elements, then during testing the circuit will have no cycles other than the self-loop of element 303. FIG. 4 shows a circuit corresponding to that of FIG. 2, but in which only the memory elements 201 and 204, corresponding respectively to vertices 301 and 304 of FIG. 3, have been selected as scan elements. Test control leads SCANIN, SCANOUT and MODE have been incorporated. The circuit is placed into the test mode by activating the MODE input. This reconfigures memory elements 201 and 204 into the scan shift register, as priorly discussed. Test data is inputted serially into the shift register by signals on input SCANIN. The states of the memory elements 201 and 204 can be read-out on lead SCANOUT after a test has been performed. Clock signals on lead CLOCK1 control the synchronous operation of the non-scan elements 200, 202, 203 and 205 of the circuit. Clock signals on lead CLOCK2 control the synchronous operation of scan elements 201 and 204. In the normal functional mode of the circuit, CLOCK1 and CLOCK2 are identical signals. However, while in test mode, only CLOCK2 is active. Thus, while the test states are shifted into elements 201 and 204 during test mode under control of CLOCK2, all non-scan memory elements retain their present states.

The above discussion is instructive for understanding and practicing the principles of the invention. However, the selection of scan memory elements in real, complex integrated circuits can pose problems that make it desirable to automate the scan element selection process. One way of automating the selection is now discussed. However, it is understood that automation is not essential and forms no part of the invention. The technique is therefore described in general terms. A file is prepared in accordance with known techniques. The contents of the file represent a directed graph of a circuit, such as that shown in FIG. 3, for which the scan elements are to be selected. If it is desired to ignore cycles of length zero, for example, then elements of the file that characterize such self-loops are removed from the file. This means that memory elements having such self-loops will be ignored in the scan element selection process insofar as the self-loops are concerned, although the same memory elements may be characterized in the file by other non-zero length cycles. The file then represents a graph containing only cycles greater in length than 1 or no cycles at all. A suitable computer program can now be used to select a small subset of vertices to eliminate the remaining cycles.

An algorithm for selecting the vertices to break all cycles may be stated in pseudocode as follows:
1. build a cycle list from the directed graph.
2. repeat steps 3 through 8 until the cycle list is empty.
3. for every vertex in the directed graph.
4. count the number of appearances in the cycle list.
5. select the vertex with the most occurrences.
6. remove cycles that include the selected vertex from the cycle list.
7. save the selected vertex on a scan list.
8. go to 2.

While the above algorithm is correct in principle, it can be shown that the problem of finding a scan list that eliminates all cycles is, in general, NP-complete. This means that run time of any algorithm for finding the scan list for removing all cycles of a circuit increases exponentially as the size of the circuit increases. Therefore, heuristics must be used to bound the computation time of the algorithm. A suitable program might divide the scan memory element selection process into several passes. In each pass, a time limit is set for the cycle finding process. When the time limit is reached for a pass, the search for more cycles in this pass is stopped. The selection of scan elements at this point is based on the incomplete list of cycles found in the pass. The corresponding vertices are removed from the directed graph and the graph is reconstructed. A new pass is then run. This process continues until the reconstructed graph contains no feedback paths.

It is worthwhile to note that eliminating a cycle automatically breaks all bigger cycles in which the eliminated cycle is embedded. Therefore, the cycle list on any given pass should only contain a set of representative cycles, i.e., no cycle in the list is embedded in any other cycle in the list. To generate such a cycle list, when a new cycle is found during a pass, the present cycle list is searched to determine whether any cycle in the list can cover or be covered by the new cycle. If there exists any cycle in the list embedded in the new cycle, the new one is simply discarded. On the other hand, if the new cycle is embedded in some cycle that is already in the list, then the new one replaces the existing cycle. If neither case is found, the new cycle is added to the list.

Figure 5:
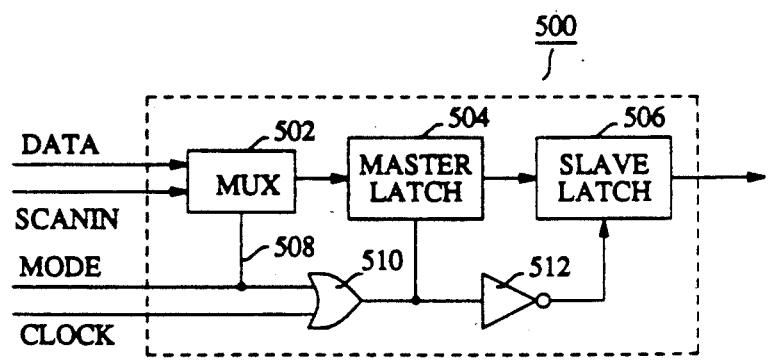
FIG. 5 shows a specific way of realizing a scan memory element operated in normal mode by a CLOCK signal and in a test mode by a MODE signal.

The circuit of FIG. 4 requires two separate clock signals, which undersirably adds an additional clock pin to an integrated circuit chip to accommodate the second clock signal. FIG. 5 shows a memory element 500 which allows the extra clock pin to be eliminated. Non-scan elements do not contain the multiplexer 502 and the OR gate 510. The CLOCK signal is routed to all scan and non-scan memory elements of a circuit. The MODE signal is routed only to scan elements. For non-scan elements, the DATA signal directly feeds into the master latch 504 and the CLOCK signal directly goes to the master latch and the inverter 512. The same is true in function for scan elements for normal operation when MODE is held low. In non-test mode, the CLOCK signal is pulsed and the MODE signal is held low. This causes all scan and non-scan elements to accept data on the DATA input. In test mode, the MODE signal is pulsed while the CLOCK signal is held low. Since non-scan elements do not receive the MODE signal, the states of these elements are not affected when test data is inputted into the scan elements under control of the MODE signal. However, for scan elements, the multiplexer 502 is controlled by the MODE signal appearing at 508 to select signals from its SCANIN input. In either test or non-test mode, the signals selected by multiplexer 502 are passed to a flip-flop consisting of a master latch 504 and a slave latch 506. The master and slave latches are controlled by either the CLOCK or the MODE signals via an OR gate 510 and an inverter 512.

It is to be understood that the above described arrangements are merely illustrative of the application of principles of the invention and that other arrangements may be devised by workers skilled in the art without departing from the spirit and scope of the invention.

We claim:

1. A method of testing a digital integrated circuit including combinational logic and a set of memory elements whose state is affected by the combinational logic, the method comprising the steps of:

establishing a test mode of a circuit by
isolating from the combinational logic a subset of the memory elements of the integrated circuit, said members of the subset being chosen such that, while in the test mode, substantially all feedback paths equal to or greater than a selected cycle length in the circuit are eliminated, wherein a feedback path is defined as a signal path from an output of a memory element to a functional data input of the memory element and the cycle length of a feedback path is defined as the number of other memory elements in the feedback path and
loading test data into the isolated memory elements;
placing the integrated circuit into an operational non-test mode for a predetermined test period;
at the expiration of the test period, reestablishing the test mode of the circuit; and
reading the state of the isolated memory elements.

2. The method of claim 1 wherein the step of isolating members of the subset further comprises eliminating substantially all said feedback paths of cycle length equal to or greater than zero.

3. The method of claim 1 wherein the step of isolating members of the subset further comprises eliminating substantially all said feedback paths of cycle length equal to or greater than one.

4. A method of designing a digital integrated circuit including combinational logic and a set of memory elements whose state is affected by the combinational logic for partial scan testing of the integrated circuit, characterized by the steps of:

identifying those memory elements of a circuit that each contain a feedback path from an output of the memory element to a functional data input of the memory element,
selecting from the identified memory elements a subset sufficient to eliminate substantially all said feedback paths in the circuit equal to or greater than a selected cycle length, wherein the cycle length of a feedback path is defined as the number of other memory elements in the feedback path, and
adding circuitry to the circuit to control its operation in a functional mode and the scan test mode, in which in the functional mode the circuit, including the memory elements of the subset, operates in accordance with the intended function of the chip, and in the scan test mode, the functional data inputs of substantially all of the subset of memory elements are isolated from the combinational logic and made available for the acceptance of test data.

5. An integrated logic circuit comprising:
combinational logic;
a set of memory elements whose state is affected by the combinational logic; and
means for partial scan testing in response to a test mode signal, the means for partial scan testing operating to isolate selected ones of the memory elements from the combinational logic and to reconfigure selected memory elements while in the isolated state to accept test data,
the integrated circuit being characterized in that
the isolation of the selected memory elements eliminates substantially all feedback paths of the circuit having a cycle length equal to or greater than a selected cycle length, wherein a feedback path is defined as a signal path from an output of a memory element to a data input of the memory element and wherein the cycle length of a feedback path is defined as the number of other memory elements in the feedback path.

6. The circuit of claim 5 wherein: the means for partial scan testing operates to isolate memory elements such that substantially all said feedback paths of length equal to or greater than zero are eliminated.

7. The circuit of claim 5 wherein: the means for partial scan testing operates to isolate memory elements such that substantially all said feedback paths of length equal to or greater than one are eliminated.

8. The circuit of claim 5 further comprising means for independently controlling the synchronous operation of the isolated and non-isolated memory elements.

9. The circuit of claim 8 wherein the means for controlling further comprise a first clock signal input for accepting signals for controlling the synchronous operation of the non-isolated memory elements and a second clock signal input for accepting signals for controlling the synchronous operation of the isolated memory elements.

10. The circuit of claim 8 wherein the means for controlling further comprise means responsive to a clock signal for controlling the synchronous operation of all of the memory elements and for selecting as data inputs to the memory elements nodes of the combinational logic, and means responsive to a mode test signal for controlling the synchronous operation of the isolated memory elements and for selecting as data inputs to the isolated memory elements test data inputs for accepting independently generated test data.

11. The circuit of claim 10 wherein the means for controlling the operation of the isolated memory elements further comprises means for reconfiguring the isolated memory elements into a shift register for accepting the test data via the test data inputs.

* * * * *